United States Patent [19]

Kapon

[11] Patent Number: 5,040,032
[45] Date of Patent: * Aug. 13, 1991

[54] SEMICONDUCTOR SUPERLATTICE HETEROSTRUCTURES ON NON-PLANAR SUBSTRATES

[75] Inventor: Elyahou Kapon, Old Bridge, N.J.

[73] Assignee: Bell Communications Research, Inc., Livingston, N.J.

[*] Notice: The portion of the term of this patent subsequent to Nov. 27, 2007 has been disclaimed.

[21] Appl. No.: 574,271

[22] Filed: Aug. 28, 1990

Related U.S. Application Data

[63] Continuation of Ser. No. 323,403, Mar. 14, 1989, Pat. No. 4,974,036, which is a continuation-in-part of Ser. No. 153,962, Feb. 9, 1988.

[51] Int. Cl.⁵ ............................................. H01L 27/12
[52] U.S. Cl. ......................................... 357/4; 357/16; 372/45; 372/46; 372/48
[58] Field of Search ................. 372/45, 46, 48; 357/4, 357/45 L, 16

[56] References Cited

U.S. PATENT DOCUMENTS 4,922,500  5/1990  Chang-Hasnain .................. 372/45
4,946,802  8/1990  Shima et al. ......................... 372/46

OTHER PUBLICATIONS

Tsang et al., "Growth of GaAs-Ga$_{1-x}$Al$_x$As Over Preferentially Etched Channels by Molecular Beam Epitaxy: A Technique for Two-Dimensional Thin-Film Definition", Mar. 1977, *Applied Physics Letters*, vol. 30, No. 6, pp. 293-296.

"Molecular Beam Epitaxy of GaAs/AlGaAs Superlattice Heterostructures on Nonplanar Substrates", E. Kapon et al., Appl. Phys. Lett., vol. 50, No. 6, pp. 347-349, Feb. 9, 1987.

Primary Examiner—Andrew J. James
Assistant Examiner—Courtney A. Bowers
Attorney, Agent, or Firm—James W. Falk; Leonard Charles Suchyta

[57] ABSTRACT

A novel quantum-well semiconductor is described wherein the quantum well is formed by growing a thin ($\leq 500$ Å) epitaxial layer on a patterned (e.g. grooved) non-planar substrate so as to achieve thickness variations along the quantum well and hence laterally varying superlattice periodicity and QW depth. Using this structure one can achieve lateral carrier confinement and real refractive index waveguiding. Index-guided GaAs/AlGaAs lasers are described.

9 Claims, 7 Drawing Sheets

THICKNESS

FAR FIELD ANGLE (DEGREES)

FIG. 7B

LATERAL DIMENSION (μm)

SEMICONDUCTOR SUPERLATTICE HETEROSTRUCTURES ON NON-PLANAR SUBSTRATES

CROSS-REFERENCE TO RELATED APPLICATIONS

This is a continuation of allowed U.S. application Ser. No. 323,402, filed Mar. 14, 1989, now U.S. Pat. No. 4,974,036 which is a continuation-in-part application of U.S. application Ser. No. 153,962, filed Feb. 9, 1988.

BACKGROUND OF THE INVENTION

1. Field of the Invention

This invention relates to a method for fabricating thin film semiconductor superlattice heterostructures and the resulting structures and devices obtainable thereby and more particularly to the production of quantum-well structures on non-planar substrates.

2. Description of the Prior Art

"Thick" (>500 Å) epitaxial layers have been grown on nonplanar substrates by various growth techniques, e.g., liquid phase epitaxy (LPE), molecular beam epitaxy (MBE), and organometallic chemical vapor deposition (OMCVD). In all cases, the nonplanarity of the substrate gives rise to lateral thickness variations in the epitaxial layers. Such laterally patterned structures have been useful for optical wave guiding (essentially because the wavelength of light is comparable to the layer thicknesses involved).

Ultra-thin (<500 Å) epitaxial layers have been grown on planar substrates. For such thin layers (i.e. layers whose thickness is comparable to the deBroglie wavelength of charge carriers) quantum-size effects in one dimension (along the growth direction) modify the material properties (e.g., bandgap and refractive index). Hence, by tailoring the thickness of the epitaxial layers, it has been possible to vary the resulting superlattice (or quantum well) material properties. For example, selection of the superlattice (SL) periodicity results in selection of the material bandgap. In addition, these superlattices give rise to new features, e.g., enhanced nonlinear optical properties. Furthermore it has been shown that the SL period (or layer thicknesses) in the direction of layer growth, allows one to fabricate structured materials in which the physical properties in the direction normal to the substrate plane differ based upon the SL period. Devices which rely not only upon the new properties of the SL materials, but also on quantum-size effects that occur in the individual layers, have also been demonstrated, e.g., quantum-well lasers, resonant tunneling devices, quantum-confined Stark effect modulators, etc.

The production of SL or quantum-well devices having superlattice structures which are more than one dimensional and/or which vary laterally in thickness is desirable in order to obtain devices having different and/or enhanced physical properties and having new and different capabilities than prior art quantum effect devices.

SUMMARY OF THE INVENTION

A method for the production of thin (≦500 Å) epitaxially grown semi-conductor layers having a laterally varying SL periodicity is described. The method comprises providing a nonplanar, e.g., a grooved, substrate on which the epitaxial semiconductor layers are grown by the usual growth techniques e.g., LPE, MBE, or OMCVD.

The thin SL or quantum-well (QW) semiconductor layers resulting from this growth vary in thickness, and hence physical properties, laterally along the substrate plane. Such variations give rise not only to layers with varying properties but also to new device structures employing such films. One characteristic of the resulting structured materials is that they may be fabricated to tailor their properties in more than one dimension.

In one particular embodiment of the invention, a crescent-shaped active region having a lateral extent less than about 1000 Angstrom units (Å) is formed in an OMCVD step.

BRIEF DESCRIPTION OF THE DRAWINGS

FIG. 7 shows typical far field (a) and near field (b) distributions of the patterned QW laser, measured in the junction plane.

DETAILED DESCRIPTION OF THE INVENTION

Generally, a method for patterning semiconductor superlattice and quantum-well heterostructures comprises growing these superlattices or quantum wells on nonplanar patterned substrates to produce variations in thickness and crystallographic orientations of the grown layers in order to introduce lateral variations of the physical properties which depend on these parameters. The lateral thickness variation results from the variation in the flux of the source beams across surfaces with different angular orientations and because of the different effective sticking coefficients associated with different crystal planes. If the patterned features are fine enough, semiconductor materials with reduced carrier dimensionality can be obtained. By proper selection of the features in the pattern, "artificial" materials useful in high speed electronics and optical signal processing can be produced.

By way of example, GaAs substrates [(100) oriented] were patterned by using conventional photo lithography and wet chemical etching. Channels, about 3 μm wide and about 2 μm deep and aligned along the [01$\bar{1}$] direction, were etched through a photoresist mask using $H_2SO_4:H_2O_2:H_2O$ (1:8:40) preferential chemical etching solution. The photoresist mask was then removed, and the patterned substrates were cleaned by degreasing, followed by etching for 45 seconds in $H_2SO_4$:$H_2O_2$:$H_2O$ (4:1:1) solution and for 4 minutes in HCl. Finally, the samples were rinsed and blown dry. The resulting grooves had rounded profiles because of the etching in the (4:1:1) solution.

A superlattice consisting of five periods of alternate 100 Å GaAs and 100 Å $Al_{0.3}Ga_{0.7}As$ layers, preceded by a thick GaAs buffer layer, was grown on the patterned samples by MBE. (The layer thicknesses are the ones obtained for a planar substrate.) The growth was carried out at 100° C. above the oxide desorption temperature, typically 680° C., and the As/Ga beam equivalent pressure ratio was about 3. The substates were rotated at 20 rpm during the growth. The superlattice growth features were studied by using transmission electron microscopy (TEM) to examine [01$\bar{1}$] cross sections of the grown samples.

Figure 1:
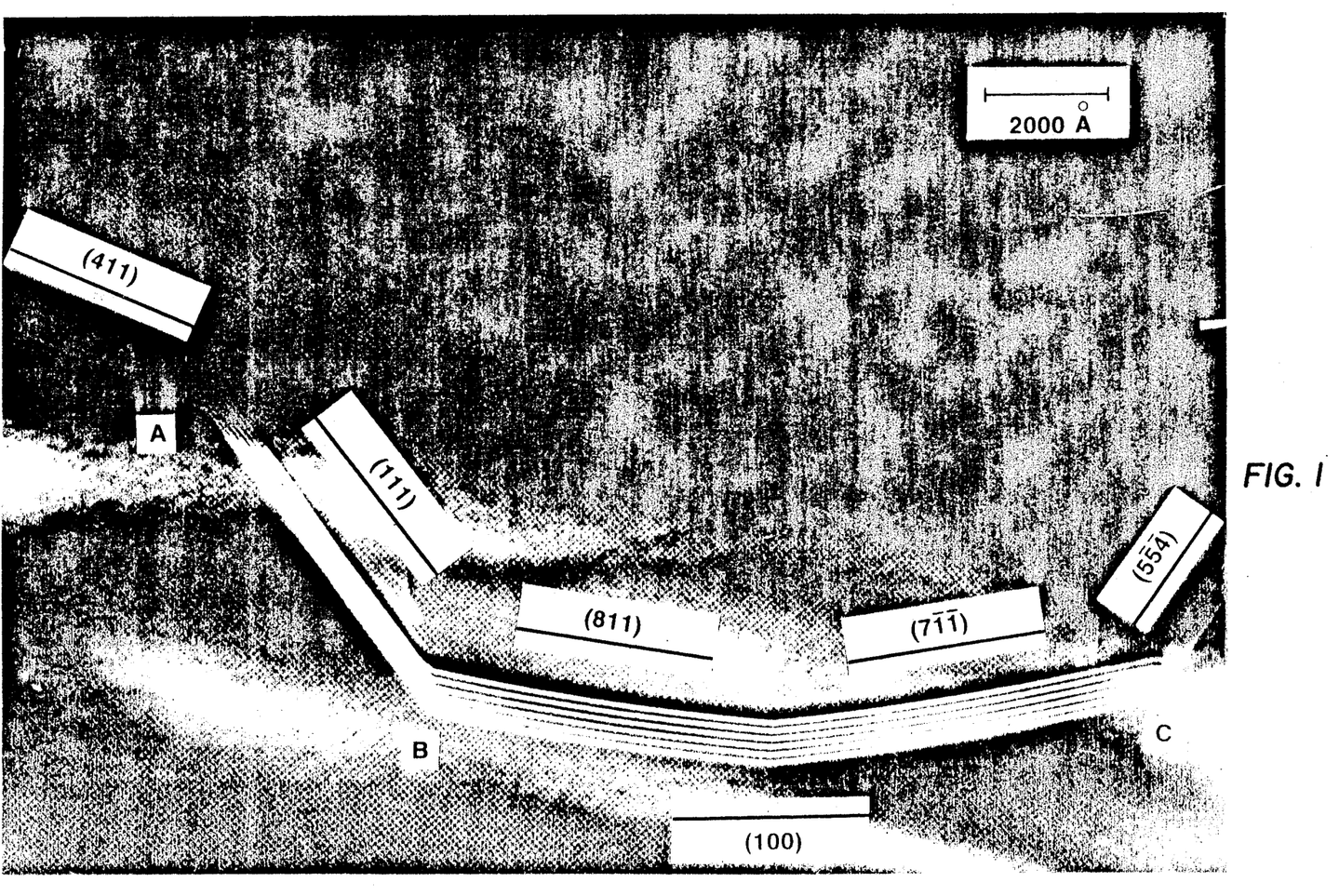
FIG. 1 is a transmission electron micrograph of a cross section of a superlattice grown in an etched groove.

FIG. 1 shows a TEM cross section of a superlattice that was grown in an etched groove. The MBE growth resulted in the formation of facets lying in specific crystal planes, as indicated in this figure. It can be seen that the superlattice period decreased significantly with increasing tilt angle of its growth plane relative to the horizontal (100) plane. This period variation arises from the difference in the growth rate, measured perpendicular to the crystal planes associated with the different planes. The difference in the growth rate results both from the variation in the flux of the source beams across planes with different orientation as well as from different sticking coefficients of the Ga and the Al atoms for different crystal planes. The asymmetry in the structure shown in FIG. 1 is probably due to a slight misalignment of the etched grooves with respect to the [01$\bar{1}$] direction.

Magnified TEM cross sections of the regions where superlattices of different periods intersect show that the change in the superlattice period is mostly smooth and occurs within <100 Å. The transition between the superlattices oriented along the (711) and the (554) planes, however, exhibits a "kink." This is believed to be a result of migration of the source atoms, after reaching the surface of the substrate, to more "favorable" crystal planes. Atoms reaching the (554) plane close to the intersection with the (711) plane, migrated to the neighboring (711) plane, which resulted in even smaller growth rate along the (554) plane in that region. Note also that the GaAs layers (the dark stripes in FIG. 1) are thinner than the AlGaAs ones in the "kink" region, which indicates that this migration effect is stronger for the Ga atoms than it is for the Al ones. The "kink" in the structure shown in FIG. 2(c) extends over 200–300 Å. This dimension is comparable to the diffusion length of the Ga and the Al atoms which migrate on the growth surface.

Table I shown in a previously published article entitled "Molecular Beam Epitaxy of GaAs/AlGaAs Superlattice Heterostructures on Nonplanar Substrates", by E. Kapon et al., *Applied Physics Letters* 50(*b*), Feb. 9, 1987, pages 347–349, lists the crystal planes that were identified in the TEM cross section of FIG. 1, along with the measured and the calculated tilt angles $\theta$ between each crystal plane and the horizontal (100) plane. Faces oriented along the {111}, {411}, and {811} planes were identified in other experiments of MBE growth on planar substrates as well. Table I also summarizes the superlattice periods (measured normal to the crystal planes) obtained in the present experiment. These periods should be compared to the period obtained for a planar substrate, which was about 200 Å. It can be seen that large variations in the periods of adjacent superlattice sections can be achieved. The superlattice section lying in the (554) plane has a period of only 80 Å. This is less than half the period of the adjacent section which lies in the (711) plane. Table I also shows the values of $\Lambda/\cos\theta$, which is a measure for the relative effective sticking coefficient, for each of the growth planes. The planes (411), (111), (811), and (711) have similar effective sticking coefficients and thus the growth rate on these planes is determined mainly by their tilt angle. The effective sticking coefficient for the (554) plane, on the other hand, is considerably smaller.

The use of the features of MBE growth on patterned substrates in the fabrication of optoelectronic devices has already been pointed out. In particular, the thickness variations exhibited by the epitaxial layers give rise to lateral variations in the effective index of refraction, which can be used to define channel optical waveguides. The demonstration of these thickness variations with epitaxial layers which are less than a few hundred angstroms in thickness, however, is important because of the quantum-size effects exhibited by such ultrathin layer heterostructures. The strong dependence of the confinement energy on the well width in quantum-well heterostructures implies that lateral variation in the quantum-well width gives rise to lateral variations in physical parameters which depend on this confinement energy. Therefore, it is expected that superlattice heterostructures grown on nonplanar substrates and showing the lateral period variations described above will exhibit lateral variations in physical properties associated with the superlattice period.

One example of a physical parameter which depends on the superlattice period is the refractive index. The lateral variations in the superlattice period can thus be used to achieve lateral patterning of the index of refraction, which is useful for various guided-wave optics applications.

Figure 2A:
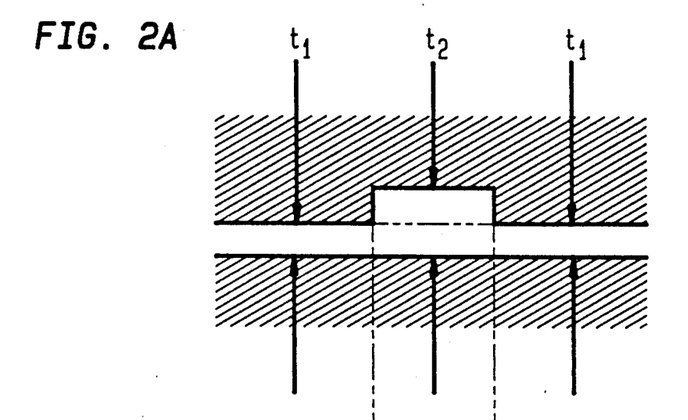
FIGS. 2a-c illustrate carrier confinement induced by quantum-well thickness variations.
Figure 2B:
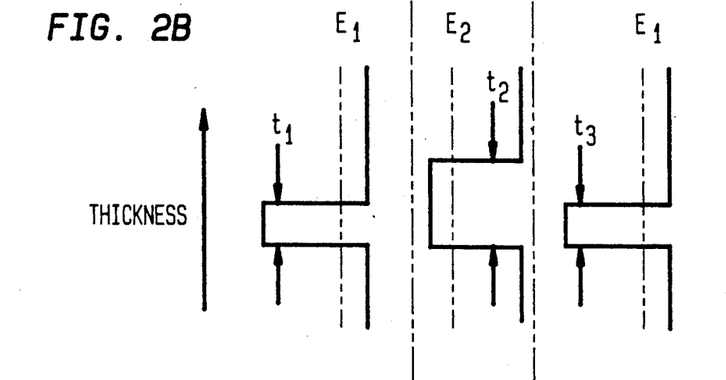
Figure 2C:
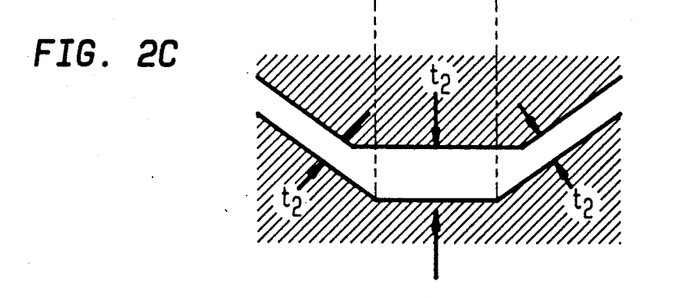

Another example of an application of these patterned superlattices is the use of the difference in the effective band gap of quantum wells of different thickness to induce carrier confinement in more than one dimension. Consider the quantum well heterostructure whose cross section is described schematically in FIG. 2(*a*). The quantum well is thicker near the center of the structure. Consequently, the lowest lying bound states have a higher energy on both sides of the structure [FIG. 2(*b*)]. Therefore, the resulting steps in the carrier energies provide an effective potential well in the lateral direction, which can serve to achieve lateral carrier confinement. FIG. 2(*c*) shows a possible way to realize such a structure, by growing a quantum well heterostructure in a groove (see also FIG. 1). For a GaAs/$Al_{0.3}Ga_{0.7}As$ quantum well heterostructure, a decrease in the well thickness from 100 to 50 Å results in an increase in the confinement energy by more than 50 meV. Such a potential step would be sufficient for achieving carrier confinement, at least at low temperatures. Quantum well thickness variations of this order can clearly be obtained by MBE growth on nonplanar surfaces, as is demonstrated herein. However, the etched grooves should be made considerably narrower (on the order of a few hundred angstroms) in order to observe quantum-size effects due to lateral carrier confinement. Such fine patterning can be achieved by using, e.g., electron beam lithography. It should be noted that additional carrier confinement effects can result in the structure described in FIG. 2(c) due to the tilt in the thinner quantum well planes with respect to the thicker one. Three-dimensional confinement of carriers might be obtained similarly by MBE growth on nonplanar substrates patterned with two-dimensional features.

The resulting structured materials now have tailored properties in more than one dimension. For example, the variation in the bandgap can be utilized in order to trap carriers in more than one dimension. Prior techniques for carrier confinement in semiconductor heterostructures involved embedding a low bandgap-material in high-bandgap regions by using etch and regrowth steps. The method set forth herein requires only a single growth step, and does not involve physical interfaces between the high- and low-bandgap materials. Applications of 3-D bandgap tailoring include semiconductor lasers, optical waveguides, diffraction gratings (e.g. gain modulation distributed feedback lasers: the periodic corrugations in the substrates are made such that $\Lambda = m\lambda_0/2n$, where $\Lambda$ is the period, m is an integer, $\lambda_0$ is the vacuum wavelength, and n is the refractive index. Then, in addition to the periodic variation in the real part of the refractive index, the imaginary part is also modulated due to the QW thickness modulation. This leads to single frequency emission.)

New advantages are obtained if the lateral dimensions of the patterned QWs (or the periods of the 3-D, 2-D SLs) are approximately less than 500–1000 Å. Then, the laterally confined carriers exhibit 2-D or 3-D quantum size effects, and the resulting structured materials exhibit quantum-wire or quantum box properties (i.e., are characterized by 1-D or 0-D carriers). As such, they are expected to have new material properties; enhanced nonlinear optical properties, for example. Semiconductor lasers made of such 3-D (or 2-D) SLs will have lower thresholds, higher modulation band width and narrower line width. New electrical transport properties of these materials are also expected.

In addition, the ability to create quantum wires and quantum boxes with this technique opens the door for a new generation of electronic devices, relying on what may be called "guided-wave electronics." Creating a single "wire" of low bandgap material surrounded by high bandgap material and thinner QWs results in one-dimensional electrons guided by the wire. For example, FIGS. 3 and 4 demonstrate a physical structure which gives rise to a two dimensional superlattice having varying thickness trapping the carriers to result in zero-dimensional electrons. Lateral thickness variations are obtained along the QW as defined by the ridge pattern. A one dimensional version of such a patterned structure would result in a QW wire.

Figure 3:
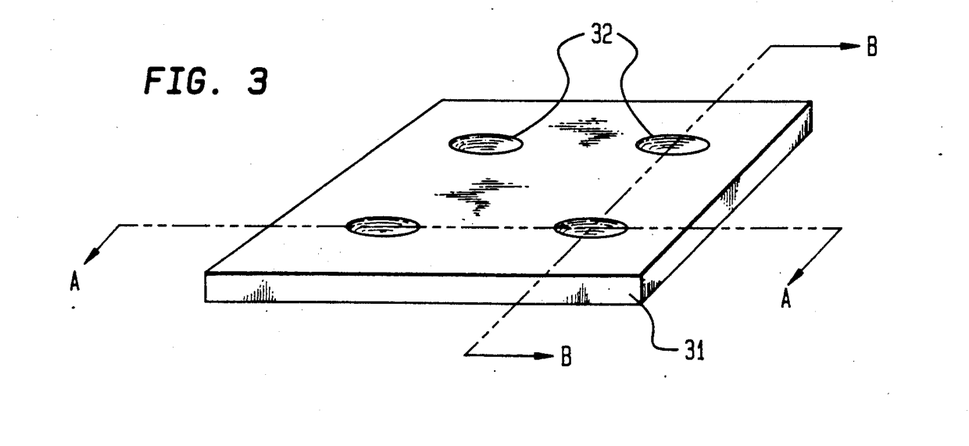
FIG. 3 is an elevational view of a semiconductor wafer having an array of patterned etched depressions in one surface thereof.
Figure 4:
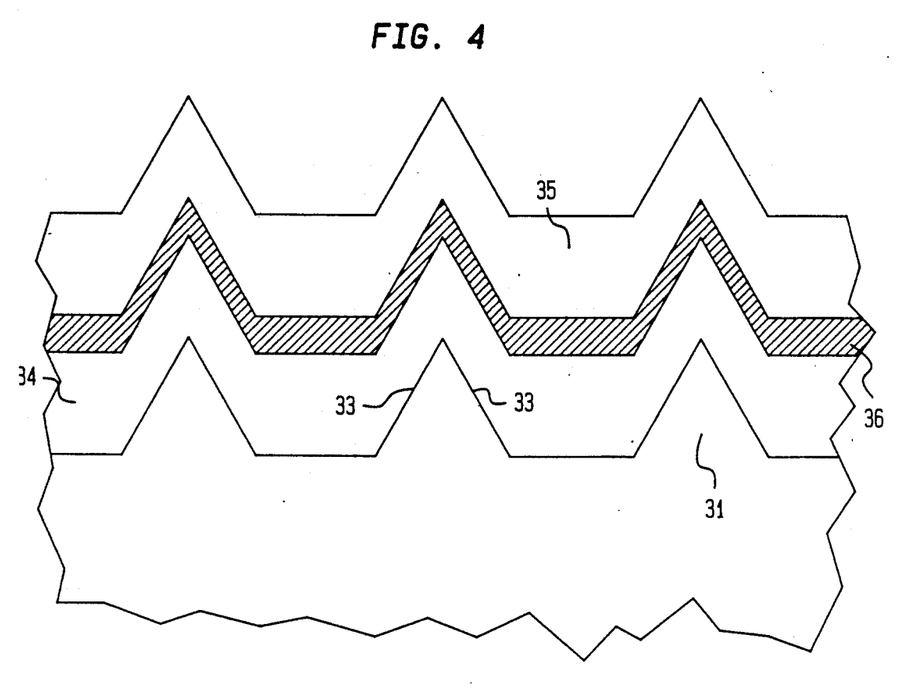
FIG. 4 is a schematic illustration of the cross section taken across A—A or B—B of the wafer shown in FIG. 3.

Referring to FIGS. 3 and 4, a structure is shown for a multi-dimensional (2-D) embodiment of the invention. Here, a single crystal substrate wafer 31, e.g., GaAs, is etched to form a plurality of spaced depressions 32 which may have circular, square or other cross sections when viewed from the top of the substrate. In addition to the depressions, the substrate 31 is etched to form a fine pattern as shown in FIG. 4. This fine pattern is what would be observed from a cross-section across either plane A—A or plane B—B of FIG. 3. Referring to FIG. 4, the fine pattern consists of a series of etched grooves 33 having a plurality of epitaxially grown layers thereover. The first epitaxial layer 34 and the top epitaxial layer 35 are high-bandgap layers having thicknesses which may exceed 500 Å. A central epitaxial layer 36 of a low-bandgap material is formed between the two high bandgap layers 34 and 35. This central layer 36 is less than 500 Å, and typically in the order of 100 Å, and varies laterally in thickness as previously described. If the thickness of the quantum well is selected such that the width of the area 37 at the base of the groove (shown by a circle in FIG. 4) is less than the de Broglie wavelength, carriers can be trapped in this area creating a QW wire along the base of the QW layer 36.

Figure 8A:
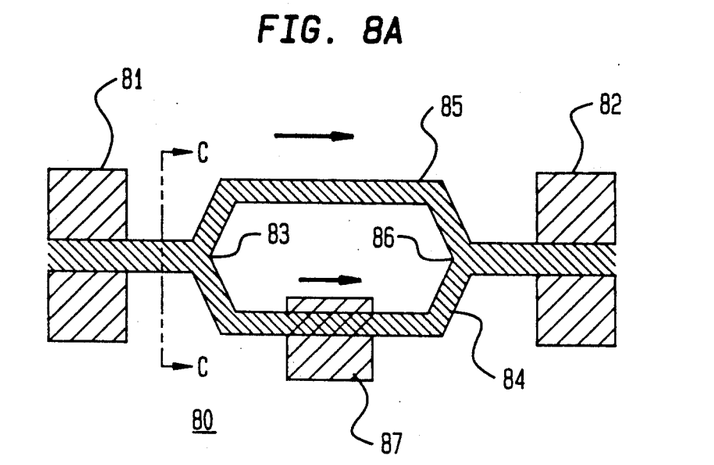
FIGS. 8a-b are a schematic illustration of a Mach-Zehnder type interferometer employing a patterned QW wire.
Figure 8B:
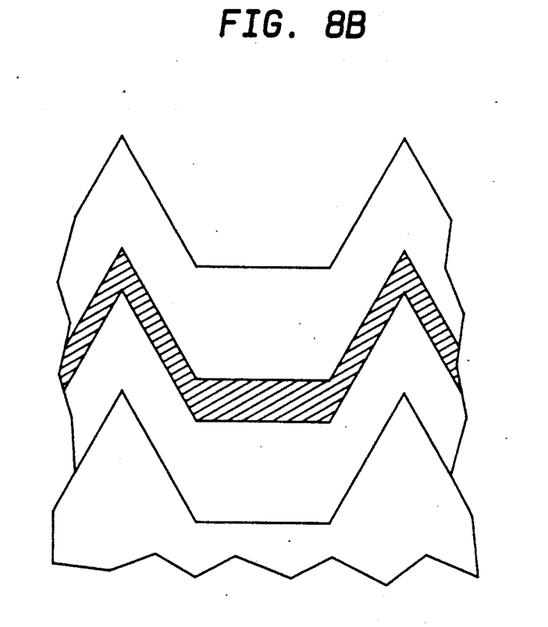

In FIG. 8 there is a representation of an interferometer which makes use of such a QW wire. Here, a semiconductor device 80 includes an emitter 81 and a collector 82. A QW wire 83 is formed which extends from emitter 81 to collector 82 and has a first fork 83 which diverges to form two arms 84 and 85 beyond the emitter 81 and recombines at a second fork 86 prior to or at the collector 82. A base region 87 extends in the area of one arm 84 of the QW wire for modulating the phase of the carrier wave functions in that arm of the QW wire. In operation, carriers are injected from the emitter into the QW wire in the region of the emitter, the carrier wave functions (initially of the same phase) are split into the two arms 84 and 85 at the fork 83. By applying an appropriate signal to the base region, a modulated phase shift can be obtained in arm 84 relative to arm 85. When the carrier wave functions recombine at the second fork 86, the current in the QW wire will be modulated in accordance with the phase modulation in the arm 84 (i.e. constructive or destructive recombination). It should be noted that this configuration can be used for light modulation as well as current modulation where the QW wire is in a laser structure and supports laser transmission.

Quantum-well (QW) heterostructure lasers offer a number of advantages over conventional heterostructure diode lasers, including a lower threshold current density, reduced temperature sensitivity and a potentially higher modulation bandwidth. Various types of stripe geometry, such as ridge waveguide and buried heterostructure configurations, have been used in the past for obtaining very low threshold QW lasers. These stripe geometries introduce the lateral patterning in the diode laser structure which is required for achieving efficient carrier and optical confinements parallel to the junction plane.

The method described herein which utilizes the lateral variations in the thickness of quantum wells grown on nonplanar substrates in order to achieve lateral patterning of the energy bandgap and the index of refraction can be employed to make a QW laser structure which relies on this QW patterning technique. By growing an otherwise conventional GaAs/AlGaAs single QW laser heterostructure on a grooved substrate, we obtain an effectively buried QW laser. The injected carriers in this laser are laterally confined to about a 1 $\mu$m wide QW stripe owing to the larger effective bandgap of the thinner QW layers on both sides of this stripe. Room temperature threshold currents as low as 6 mA (with uncoated facets) have been obtained.

Figure 5:
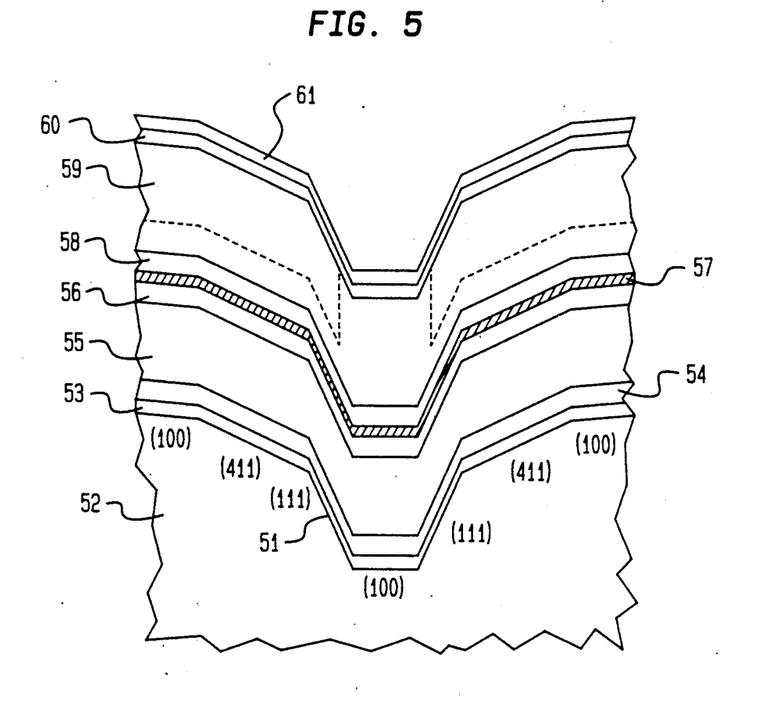
FIG. 5 is a schematic illustration of the cross section of a patterned quantum-well laser.

The schematic cross section of the patterned QW laser is shown in FIG. 5. Fabrication of the lasers began by etching V-shaped grooves 51 along the [011] crystal direction on a (100) oriented n+-GaAs substrate 52. The grooves 51 were etched through a photoresist mask by using $H_2SO_4:H_2O_2(30\%):H_2O$ (1:8:40 by volume), and were 10 $\mu$m wide and 7 $\mu$m deep. Prior to the epitaxial growth, the grooved substrates 52 were cleaned by degreasing, followed by etching first in HCl for 2 min., then in $H_2SO_4:H_2O_2(30\%):H_2O$ (4:1:1) for 2 min. and finally in HCl for an additional 2 min. The heterostructure layers were then grown by molecular beam epitaxy (MBE) at 700° C. under an arsenic-rich atmosphere.

The single quantum well, separate confinement laser heterostructure consisted of a 0.5 μm GaAs buffer layer 53 (Si, $n=2.10^{18}$ cm$^{-3}$) 5 periods of a 150 Å GaAs/150 Å $Al_{0.5}Ga_{0.5}As$ buffer superlattice 54, (Si, $n=10^{18}$ cm$^{-3}$), a 1.25 μm $Al_{0.5}Ga_{0.5}As$ cladding layer 55 (Si, $n=10^{18}$ cm$^{-3}$), a 0.2 μm $Al_xGa_{1-x}As$ waveguide layer 56 with x linearly graded from 0.5 to 0.2, performed by rapid switching of the Al shutter (Si, $n=1.10^{17}$ cm$^{-3}$), a 70 Å undoped GaAs active layer 57, a 0.2 μm $Al_x$-$Ga_{1-x}As$ waveguide layer 58, x=0.2–0.5 (Be, $p=1/.10^{17}$ cm$^{-3}$), a 1.25 μm $Al_{0.5}Ga_{0.5}As$ cladding layer 59 (Be, $p=1.10^{18}$ cm$^{-3}$ and a 0.2 μm GaAs contact layer 60 (Be, $p=5.10^{18}$ cm$^{-3}$). The layer thicknesses indicated above are for the case of a planar, (100) oriented substrate. The actual grown layers exhibit lateral thickness variations in the vicinity of the groove, as is evident from scanning electron microscope (SEM) photographs (not shown) of a cleaved sample. Facets oriented parallel to the {111} and the {411} crystal planes form, and the growth rate normal to these planes is about 50 and 80 percent, respectively, of the growth rate in the (100) direction. Transmission electron microscopy studies show that the thicker (~70 Å), (100) oriented GaAs QW at the center of the structure is bounded by thinner (~40 Å), (111) oriented QW layers on both sides. The width of the (100) oriented QW stripe is ~1 μm. It is interesting to note the existence of lateral tone variations along the Si doped $Al_{0.5}Ga_{0.5}As$ layer visible in the SEM's which probably represent doping type variations.

Figure 6:
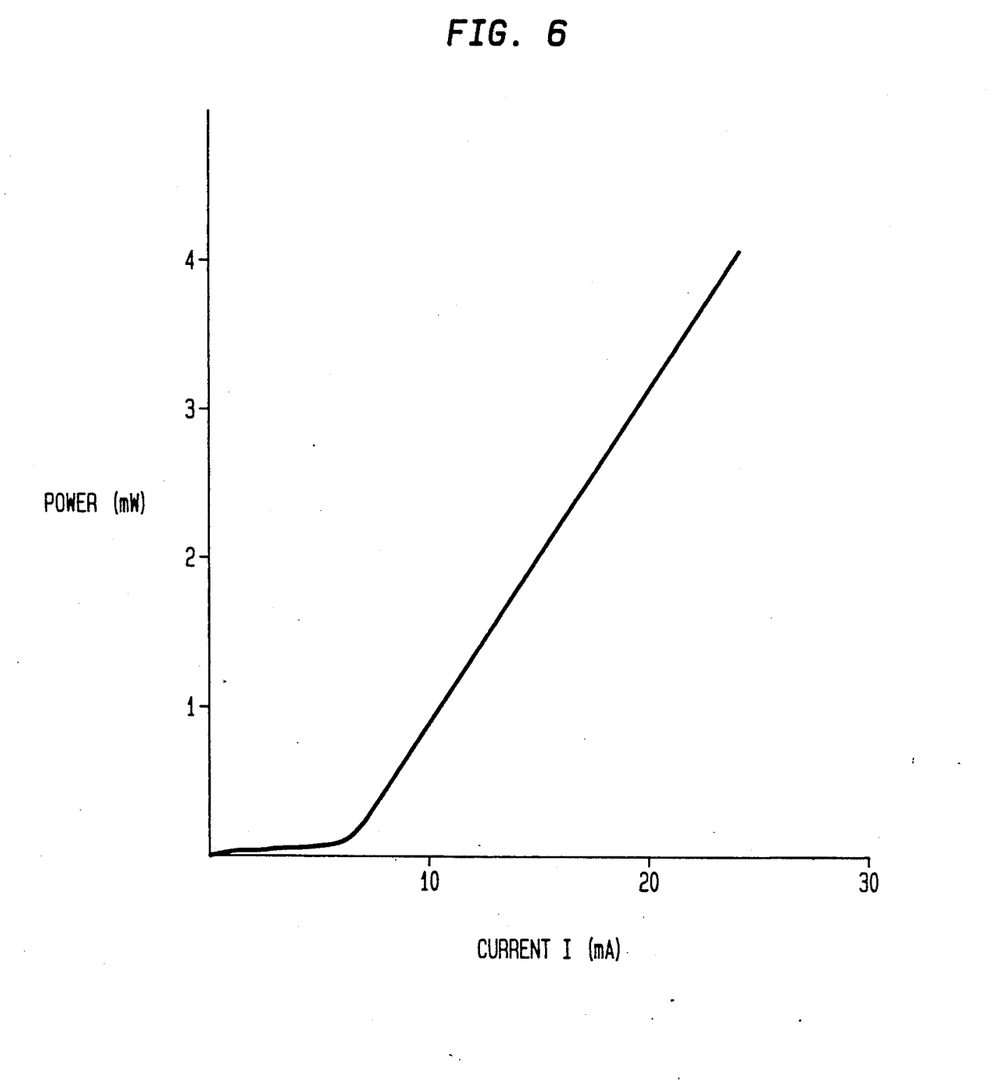
FIG. 6 is a graph showing the light output in terms of power versus the current characteristic of a patterned, 280 micron long quantum-well (QW) laser with pulsed operation at room temperature.

The grown wafers were processed into diode lasers by evaporating AuBe/Au contacts 61 on the p side, thinning the substrate and evaporating AuGe/Au n-contacts (not shown). Lateral current confinement was obtained by defining a 2 μm wide conductive stripe at the bottom of the groove using proton implantation (100 keV energy, $3.10^{15}$ cm$^{-2}$ dose; see FIG. 5). The lasers were tested at low duty cycle (200 nsec pulses, 1 kHz repetition rate). Their optical field patterns were evaluated by employing a video camera and a video analyzer. Below threshold, spontaneous emission emanated mainly from the (100) oriented QW stripe at the center of the structure. Weaker spontaneous emission occurred at the (100) oriented regions at the "shoulders" of the structure, probably due to current leakage. Above threshold, the device lased in a single almost circular spot, with lateral full width at half maximum (FWHM) of 2 μm. The threshold current was as low as 6 mA (for uncoated devices) and the differential efficiency was 35 percent. The light (power output) versus current characteristics were linear up to more than four times the threshold current (see FIG. 6). In this range of currents the spectrum of the laser exhibits a few (3–4) longitudinal modes and is centered about $\lambda = \sim 8450$ Å.

Figure 7A:
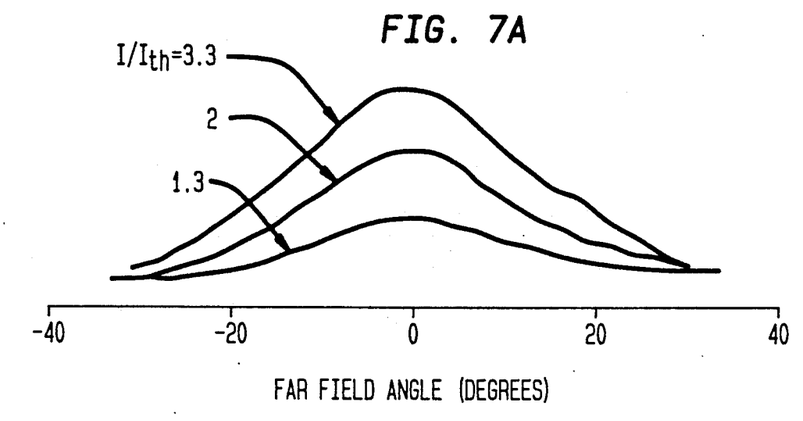
Figure 7B:
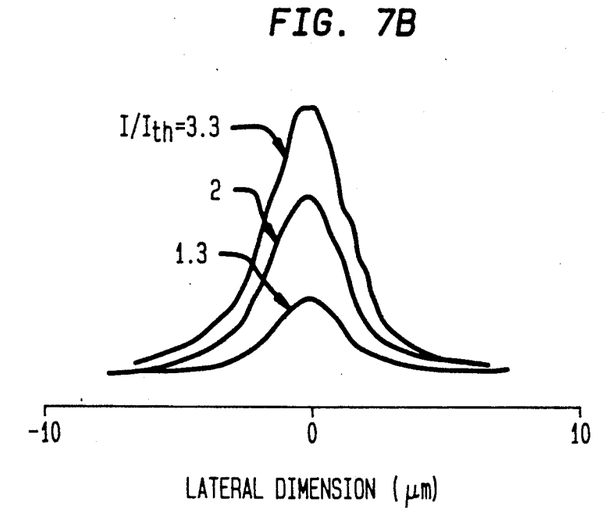

Typical far field and near field distributions of the patterned QW laser, measured in the junction plane, are given in FIG. 7a & b, respectively. Stable fundamental mode operation was observed up to four times the threshold current.

The patterned QW lasers lased in a single spatial spot at $\lambda = \sim 8450$ Å up to about four times the threshold currents. At higher currents, two additional lasing spots appeared at the "shoulders" of the structure where the spontaneous emission due to current leakage had been observed. The wavelength for these additional lasing spots was also at ~8450 Å which is consistent with the fact that the QW layers at the (100) stripe in the center as well as in the (100) shoulders have a similar thickness. At still higher diode currents, lasing occurred at the {411} oriented regions (see FIG. 5), for which the emission wavelength was ~8150 Å. This wavelength corresponds to the thinner (~55 Å) QW at the {411} oriented sections of the active layer. Lasing from the thinnest, {111} oriented QW's has not been observed at this time.

These observations indicate that carriers which are injected into the (100) oriented QW stripe at the center of the laser are laterally confined to this stripe, which is ~1 μm wide. This lateral dimension is considerably smaller than the carrier diffusion length. The lateral carrier confinement is achieved probably due to the effective lateral potential barriers which result from the reduced thickness (and possibly the different orientation) of the {111} oriented QW's.

The absence of lasing from the {111} oriented QW's could be the result of the peculiar doping distribution observed in the Si doped $Al_{0.5}Ga_{0.5}As$. Si is amphoteric in GaAs and AlGaAs and has been shown to give rise to n-doping on the (100) planes and to p-doping on the {111} planes of layers grown on nonplanar substrates. Therefore, the Si doped $As_{0.5}Ga_{0.5}As$ cladding layer in our laser structure is expected to be n-type in the (100) oriented sections and p-type in the {111} sections. This should result in the relocation of the p-n junction to the substrate-$Al_{0.5}Ga_{0.5}As$ interface, and hence an elimination of carrier injection into the QW, at the {111} oriented sections.

The far field distribution of the patterned QW lasers (FIG. 7(a)) and their spectral characteristics show that their optical field is predominantly index guided. The built-in lateral distribution of the refractive index results from the lateral variation in the thickness of the epitaxial layers (including the QW layer), and their nonplanar configuration. It should be noted that the higher bandgap of the thinner QW's surrounding the active, (100) oriented QW stripe makes these regions transparent at the laser wavelength. This reduces the threshold current and increases the differential efficiency. Furthermore, the absence of substantial interband absorption in the {111} oriented QW's results in real index guiding of the optical field which, in spite of its very narrow near field distribution, exhibits a single lobe far field distribution (see FIG. 7).

The patterned QW lasers exhibit low threshold currents, as low as 6 mA for 280 μm long devices. This value is comparable to the best values (5 mA) achieved with QW GaAs/AlGaAs lasers made by a single growth step, but is still larger than the lowest value that has been achieved with buried-heterostructure (BH) QW lasers (2.5 mA for uncoated lasers at room temperature). However, lower threshold currents and higher differential efficiencies should be achievable with the patterned QW laser configuration by reducing the current leakage and optimizing the laser structure. In particular, the structure described here can be used to make lasers with substantially narrower active regions using a sharper V-groove. For sufficiently narrow active regions (a few hundred Angstroms) such lasers are expected to exhibit one dimensional (quantum wire) carrier characteristics which should lead to diode lasers with interesting and useful physical properties. Similar patterned QW lasers grown on nonplanar substrates delineated by two dimensional features might yield QW lasers with zero-dimensional carriers (quantum box lasers).

In conclusion, we have demonstrated a patterned QW heterostructure injection laser grown by MBE in which the lateral carrier confinement relies on thickness and growth plane variations of the active QW layer. This results in an effectively buried heterostructure laser that can be fabricated by a single crystal growth step. The patterned QW GaAs/AlGaAs lasers are characterized by a low threshold current, as low as 6 mA at room temperature. Furthermore, the patterned QW laser structure is suitable for obtaining semiconductor lasers with very small lateral dimensions, which should be useful in the fabrication of quantum wire and quantum box laser heterostructures. Furthermore, the low absorption in the thinner QW regions in this laser structure makes it attractive for use in phase locked arrays of semiconductor lasers.

As indicated earlier above, significant advantages are achieved if patterned QWs of the type described herein are fabricated to have lateral dimensions that are less than about 1000 Å. Thus, for example, QW lasers made with such narrow lateral dimensions should exhibit very low threshold currents (in the microampere region), higher modulation bandwidths and narrower spectral linewidths compared with QW lasers whose lateral dimensions are considerably wider.

The fabrication of QW devices having lateral dimensions less than about 1000 Å can be carried out by forming extremely narrow grooves in a substrate. As discussed earlier, this can be done, for example, by patterning the substrate utilizing high-resolution techniques of electron beam lithography.

In accordance with the principles of the present invention, patterned QW devices having lateral dimensions less than about 1000 Å can also be made without utilizing high-resolution lithographic techniques. Devices made without high resolution lithography can typically be fabricated more quickly and less expensively than those that require lithography.

In accordance with this invention, a unique technique is utilized to fabricate a semiconductor QW device that comprises an extremely narrow elongated crescent-shaped active region. A particular illustrative QW laser device made by this technique is described below and shown (not drawn to scale) in FIG. 9.

Figure 9:
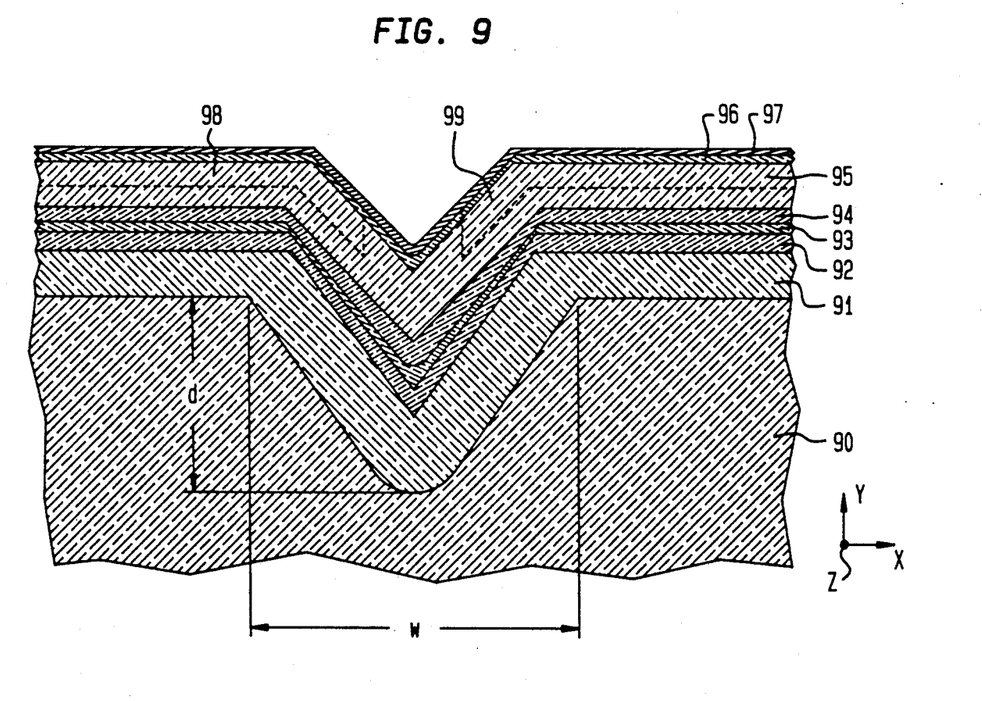
FIG. 9 is a cross-sectional depiction of another specific illustrative patterned quantum well laser made in accordance with the principles of the present invention.

By way of a specific example, the laser device depicted in FIG. 9 is formed on a substrate 90 that comprises (100)-oriented n+-GaAs. Illustratively, channels or grooves each having a width w of about 5 μm and a depth d of about 5 μm are formed in the substrate 90 by, for example, conventional chemical etching techniques. One such groove is shown in FIG. 9. Each groove extends in the indicated Z direction along the [011] direction of the substrate 90. Also, the sloped walls of each groove comprise {111} planes of the substrate 90. This is accomplished, for example, by wet etching in $H_2SO_4:H_2O_2:H_2O$ (1:8:40 by volume) through a photoresist mask.

In accordance with the principles of the present invention, multiple layers are successively grown on the grooved substrate 90 of FIG. 9 to form a quantum-wire-like laser device. Advantageously, each such layer of the device is grown by organometallic chemical vapor deposition (OMCVD) techniques. This growth is carried out at about 700-to-850 degrees Celsius.

Illustratively, the first two layers 91 and 92 grown on the grooved substrate of FIG. 9 each comprise an aluminum gallium arsenide layer. Significantly, each of the layers 91 and 92 grows on the aforementioned {111} planes but not on the (100) plane. As a result, each of the layers 91 and 92 grows within the depicted groove to form a very sharp V-corner between two {111} planes.

Specifically, the layer 91 comprises, for example, n-$Al_xGa_{1-x}$As, where x equals 0.5 to 0.7, whose thickness on a flat surface is approximately 1.25 μm. The layer 92 comprises, for example, a conventional graded-index layer of n-$Al_xGa_{1-x}$As whose thickness on a flat surface is about 0.2 μm.

The formation of the aforementioned sharp V-corners is essential to the structure described herein. Such a corner can be obtained only with sufficiently large Al mole fractions in the deposited layers. Illustratively, this condition is met with values of x equal to or greater than approximately 0.3. For the best performance of lasers based on this structure, a value of x between about 0.5 and 0.7 is advantageous.

An active QW layer 93 is then grown overlying the layer 92. The layer 93 comprises, for example, a layer of GaAs whose thickness on a flat surface is about 70 Å. The active GaAs QW layer 93 grows faster at the center of the underlying V-shaped groove than it does on the {111} planes, which gives rise to the formation of a crescent-shaped QW active region, as indicated in FIG. 9. In one particular case, the QW crescent was approximately 100 Å thick at the center and tapered to about 30 Å at the sides. The width of the active crescent was only about 500 Å.

Layers 94 and 95 in FIG. 9 comprise in effect mirror images of the layers 92 and 91, respectively. Illustratively, the layer 94 comprises a conventional graded-index layer of p-$Al_xGa_{1-x}$As whose thickness on a flat surface is about 0.2 μm, and the layer 95 comprises a layer of p-$Al_xGa_{1-x}$As whose flat-surface thickness is approximately 1.25 μm.

Layer 96 in FIG. 9 comprises a contact layer of p+-GaAs whose flat-surface thickness is about 0.2 μm. Layer 97 comprises a metallic (e.g. Ti/Au) contact whose thickness is approximately 0.2 μm.

Illustratively, the device shown in FIG. 9 also includes proton-(or H+) implanted regions 98 and 99. These insulating regions contribute to restricting current flow in the depicted device to the aforementioned Z-direction active crescent made of GaAs.

Lateral tapering in the graded-index layers 92 and 94 results in a two-dimensional optical waveguide surrounding the quantum-wire-like crescent-shaped active region in the layer 93. This optical confinement, together with the carrier confinement in the QW crescent, provide the basis for the operation of these quantum-wire injection lasers.

A narrow elongated QW region of the type described above and represented in FIG. 9 provides a quantum-wire-like structure. Such a structure is useful in a variety of practical applications (e.g. in electron devices based on electron interferometry) where simply made and inexpensive QW wires are advantageous for forming devices.

What is claimed is:
1. A quantum-well heterostructure comprising a nonplanar single-crystal substrate having a patterned surface, and a quantum-well epitaxial film on said substrate, said quantum-well film characterized by a laterally varying thickness over the patterned portion of said substrate, wherein said quantum-well epitaxial film includes a quantum-well region capable of confining charge carriers therein, and wherein said epitaxial film has a thickness of less than about 500 Å.

2. A heterostructure as in claim 1 wherein the patterned surface of said substrate includes at least one groove having a bottom surface and side surfaces.

3. A heterostructure as in claim 2 wherein the thickness of said quantum-well epitaxial film overlying the bottom surface of said groove is greater than the thickness of said quantum-well epitaxial film overlying the side surfaces of said groove.

4. A heterostructure as in claim 3 wherein charge carriers are laterally confined approximately to the quantum-well epitaxial film overlying the bottom surface of said groove.

5. A heterostructure as in claim 4 wherein said epitaxial film comprises GaAs and constitutes the active layer of a quantum-well laser.

6. A quantum-well laser comprising
a substrate having at least one groove formed in a surface region thereof,
and a quantum-well active layer overlying said groove and having a laterally varying thickness over said groove,
wherein said groove includes a bottom portion and side portions, wherein the thickness of the active layer overlying the bottom portion of said groove is greater than the thickness of the active layer overlying the side portions of said groove,
and wherein the thickness of said active layer is less than about 500 Å.

7. A quantum-well laser as in claim 6, further comprising a lower cladding layer underlying said active layer and an upper cladding layer overlying said active layer, said cladding layers comprising respective materials of higher bandgaps than a bandgap of said active layer.

8. A quantum-well laser as in claim 7, wherein said upper and lower cladding layers comprise respective regions of opposite conductivity type.

9. A quantum-well laser as in claim 8, further comprising current guiding means disposed in said cladding layers for guiding current to said active layer overlying the bottom portion of said groove.

* * * * *